United States Patent [19]
Camlibel et al.

[11] Patent Number: 4,510,514
[45] Date of Patent: Apr. 9, 1985

[54] OHMIC CONTACTS FOR SEMICONDUCTOR DEVICES

[75] Inventors: Irfan Camlibel, Stirling; Aland K. Chin, Berkeley Heights, both of N.J.

[73] Assignee: AT&T Bell Laboratories, Murray Hill, N.J.

[21] Appl. No.: 521,443

[22] Filed: Aug. 8, 1983

[51] Int. Cl.³ ............................................ H01L 23/54
[52] U.S. Cl. ...................................... 357/17; 357/67; 357/71; 427/89; 427/91
[58] Field of Search ................. 427/89, 91; 357/67, 357/71, 17

[56] References Cited

U.S. PATENT DOCUMENTS

| | | | |
|---|---|---|---|
| 3,959,522 | 5/1976 | Ladany | 427/89 |
| 4,179,534 | 12/1979 | Chang | 427/89 |
| 4,395,727 | 7/1983 | Lauterbach | 357/71 |
| 4,414,561 | 11/1983 | Keramidas | 427/89 |

OTHER PUBLICATIONS

"Interdiffusion of Thin Cr and Au Films Deposited on Silicon", *Thin Film Solids*, vol. 38, G. Majni et al., 1976, pp. 15–19.

"Ohmic Contacts to InP and InGaAsP", *Inst. Phys. Conf. Ser.* No. 56, Chap. 5, V. G. Keramidas et al., 1981, pp. 293–299.

"Low Resistance Ohmic Contacts to p-InP", *Electronics Letters*, vol. 18, No. 17, C. L. Cheng et al., Aug. 19, 1982, pp. 755–756.

*Primary Examiner*—John D. Smith
*Attorney, Agent, or Firm*—Lester H. Birnbaum

[57] ABSTRACT

Disclosed is an indium-containing semiconductor device which includes an ohmic contact formed by application of successive layers of Au-Sn-Cr-Au. The combination of Sn and Cr layers provides an effective barrier to the diffusion of indium to the surface of the contact so that bonding to the contact is not impeded.

5 Claims, 2 Drawing Figures

OHMIC CONTACTS FOR SEMICONDUCTOR DEVICES

BACKGROUND OF THE INVENTION

This invention relates to semiconductor devices, and in particular, to providing ohmic contacts to indium-containing devices.

Semiconductor devices which operate in the long-wavelength region of 1.0 to 1.7 μm are gaining increasing importance in the optical communication field due to their capacity for transmitting and receiving at high bit rates over long distances. Indium-containing devices, such as FETs, LEDs, and photodetectors based on the InP/InGaAsP materials, appear particularly promising for future systems. One problem which exists, however, is providing reliable ohmic contact to the device. For example, typical alloy contacts to the n-type InP substrates include multi-layers of gold and a suitable dopant such as tin (see, e.g., Keramidas et al, "Ohmic Contacts to InP and InGaAsP", *Inst. Phys. Conf. Ser.*, Vol. 56, p. 293 (1981)). Indium has a strong tendency to diffuse into the contact metals and either react with the top gold layer or oxidize. In either case, wire bonding to the surface of such contacts is difficult, resulting in yield and reliability problems.

It is therefore a primary object of the invention to provide a metallization for contacting indium-containing devices so that bonding to the contact is not impeded.

SUMMARY OF THE INVENTION

This and other objects are achieved in accordance with the invention which is a method of fabricating a semiconductor device including providing ohmic contact to a surface of the device and the resulting product. In accordance with the method aspects of the invention, a first layer of gold is deposited on the surface of the device. A second layer of tin is then deposited thereon followed by deposition of a third layer of chromium. A fourth layer of gold is deposited over the chromium layer. The structure is then heated to form an alloy contact with the semiconductor device. In accordance with the device aspects of the invention, the ohmic contact comprises an alloy region including indium, gold and tin formed in the surface of the device. A layer comprising chromium is formed over the alloy region and a layer comprising gold is formed over the chromium layer.

BRIEF DESCRIPTION OF THE DRAWING

These and other features of the invention are delineated in detail in the following description. In the drawings.

It will be appreciated that for purposes of illustration these figures are not necessarily drawn to scale.

DETAILED DESCRIPTION

Figure 1:
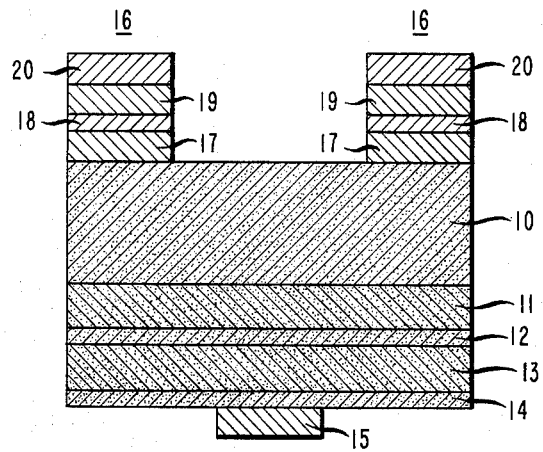
FIG. 1 is a cross-sectional view of a device during one stage of fabrication in accordance with one embodiment of the invention.

The basic principles of the invention will now be described with reference to the particular device fabrication illustrated in FIGS. 1 and 2. FIG. 1 illustrates, in cross-section, a typical semiconductor light emitting device structure which may utilize the present invention. The device starts with a substrate, 10, comprising n-type InP which is S-doped to a concentration of approximately $5 \times 10^{18}$ cm$^{-3}$ and has a <100> surface orientation. Formed on one major surface of the substrate was a buffer layer, 11, comprising n-type InP which was grown by liquid-phase epitaxial techniques to a thickness of approximately 4 μm and doped with Sn. The active layer, 12, which comprises InGaAsP, was formed on layer, 11, by liquid phase epitaxy to a thickness of approximately 0.7 μm. Formed on the active layer was a confining layer, 13, comprising p-type InP with a thickness of approximately 2.0 μm and doped with Zn. A layer, 14, comprising p-type InGaAsP was also grown by liquid phase epitaxy over layer, 13, to provide a contact layer. A metal contact, 15, was provided to the p-side of the device and comprised a Be-Au alloy.

The contact, 16, to the n-type substrate, 10, which is the focus of the present application, is provided in an annular geometry to permit light to be transmitted through the central opening. The invention, however, is not limited to any particular surface geometry.

The contact is formed by successive deposition of multiple layers, in this case by electron beam evaporation through a shadow mask. A first gold layer, 17, was deposited on the surface of the substrate to a thickness of approximately 2000 Å. The purpose of this layer is to wet the surface of the semiconductor so the later-deposited dopant material can be uniformly distributed over the semiconductor surface. Consequently, the thickness of this layer should be in the range 100–3000 Å. Deposited over the first gold layer was a second layer, 18, comprising tin, which serves as the dopant material. In this example, the tin layer was approximately 500 Å, but should generally be within the range 100–1000 Å. The penetration of the contact metal into the semiconductor after alloying is approximately the total thickness of the first gold layer and the second tin layer. The maximum thickness of layers, 17 and 18, is therefore governed by the maximum penetration depth allowed in the device structure. A third layer, 19, comprising chromium was deposited over the tin layer to a thickness of approximately 2000 Å. This layer, in combination with the tin layer, blocks essentially all diffusion of In to the surface of the contact as discussed later. The thickness of this layer is preferably in the range 1500–4000 Å to provide an effective diffusion barrier and to minimize stress effects. A fourth layer of gold, 20, was deposited over the chromium layer to permit bonding of external leads to the contact. In this example, the layer was approximately 10,000 Å but would generally be in the range 5000–20,000 Å.

After deposition of the multi-layer structure, the device was heated to form the alloy contact. In this example, alloying was accomplished by heating at 420° C. for approximately 6 minutes in an atmosphere of hydrogen and nitrogen. In general, a temperature in the range 350°–450° C. for 1–10 minutes would be useful.

Figure 2:
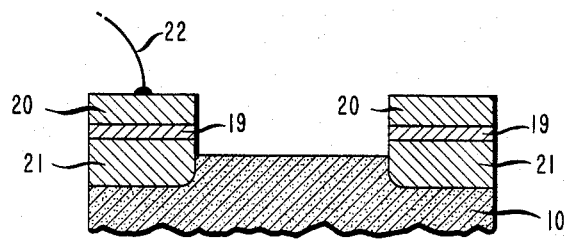
FIG. 2 is a cross-sectional view of a portion of the device of FIG. 1 during a later stage of fabrication.

As illustrated in FIG. 2, the heating causes penetration of the first gold layer and second tin layer into the semiconductor. The resulting region, 21, comprises mainly tin-doped gold-phosphorus compounds and gold-indium-tin alloys. The thickness of the alloy region in this example is approximately 5000 Å and will typically be in the range 400–8000 Å. It will be noted that the chromium layer, as well as the top gold layer, remain essentially intact on the semiconductor surface as determined by lapping and selective removal of the top gold layer, 20, by chemical etching X-ray microanalysis on a scanning electron microscope revealed, within the sensitivity limit of the analysis, that no Cr or In was present on the surface of the contact (i.e., amounts less than 0.1 atomic percent).

External electrical contact was provided, as also illustrated in FIG. 2, by attachment of wire, 22, to the top gold layer, 20. Since there was essentially no In at the surface, bonding was done easily and reliably. In this particular example, standard ultrasonic ball-bonding of the wire was employed, but other standard wire-bonding techniques could be utilized.

The diffusion barrier to indium is apparently set up by some interaction of the Sn and Cr layers. Although Cr has been suggested as a diffusion barrier on silicon devices (see, e.g., Majni et al, "Interdiffusion of Thin Cr and Au Films Deposited on Silicon", *Thin Film Solids*, Vol. 38, pp. 15–19 (1976)), a chromium layer by itself apparently will not provide an effective barrier to indium migration due to grain boundary diffusion. For example, when a 2000 Å thick chromium layer was utilized as part of a Au-Cr-Au multi-layer contact, approximately 1–2 atomic percent In was discovered at the contact surface. This is sufficient to cause bonding problems. However, as noted above, a combination of Sn and Cr layers produces less than 0.1 atomic percent indium at the surface. It is believed that this is due to the fact that tin atoms occupy the grain boundaries in the Cr layer and block the passage of In atoms.

Although the invention has been described with reference to an InP/InGaAsP heterostructure, it should be appreciated that the invention is useful in the fabrication of any semiconductor device which contains significant amounts of indium (at least 0.1 atomic percent).

Various additional modifications will become apparent to those skilled in the art. All such variations which basically rely on the teachings through which the invention has advanced the art are properly considered within the spirit and scope of the invention.

What is claimed is:

1. An indium-containing semiconductor device, including an ohmic contact to a surface of the device comprising:

an alloy region comprising indium, gold and tin formed in the said surface of the device; a layer comprising chromium formed over the alloy region; and a layer comprising gold formed over the chromium layer.

2. The device according to claim 1 further comprising a wire bonded to the top surface of said gold layer.

3. The device according to claim 1 wherein there is less than 0.1 atomic percent indium present on the surface of the gold layer.

4. The device according to claim 1 wherein the thickness of the alloy region is within the range 400–8000 Å, the thickness of the chromium layer is within the range 1500–4000 Å and the thickness of gold layer is within the range 5000–20,000 Å.

5. The device according to claim 1 wherein the contact is provided to an n-type InP substrate which is part of an InP/InGaAsP heterostructure light emitting device.

* * * * *